(12) United States Patent
Ribeiro do Nascimento

(10) Patent No.: US 10,530,365 B1
(45) Date of Patent: Jan. 7, 2020

(54) LOW VOLTAGE LEVEL SHIFTER SUITABLE FOR USE WITH SUBTHRESHOLD LOGIC

(71) Applicant: NXP USA, Inc., Austin, TX (US)

(72) Inventor: Ivan Carlos Ribeiro do Nascimento, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/013,450

(22) Filed: Jun. 20, 2018

(51) Int. Cl.
  *H03L 5/00* (2006.01)
  *H03K 19/0185* (2006.01)
  *H03K 19/20* (2006.01)

(52) U.S. Cl.
  CPC ..... *H03K 19/018521* (2013.01); *H03K 19/20* (2013.01)

(58) Field of Classification Search
  None
  See application file for complete search history.

(56) References Cited

U.S. PATENT DOCUMENTS

| | | | |
|---|---|---|---|
| 8,854,348 B2 | 10/2014 | Cho | 345/210 |
| 2008/0238523 A1 | 10/2008 | Thorp et al. | |
| 2010/0301818 A1 | 12/2010 | Kim | |
| 2012/0194256 A1 | 8/2012 | Chen | |
| 2013/0162294 A1 | 6/2013 | Henmi et al. | |
| 2017/0154568 A1* | 6/2017 | Tsuchi | G09G 3/2092 |
| 2018/0204503 A1* | 7/2018 | Tsuchi | G09G 3/2092 |

OTHER PUBLICATIONS

Kim, Yejong et al., "SLC: Split-Control Level Converter for Dense and Stable Wide-Range Voltage Conversion"; Department of Electrical Engineering and Computer Science; University of Michigan; Ann Arbor, MI 48109; IEEE 2012; pp. 478-481.

Shao, Hui et al., "A Robust, Input Voltage Adaptive and Low Energy Consumption Level Converter for Sub-threshold Logic", Department of Electronic and Computer Engineering, The Hong Kong University of Science and Technology, Hong Kong SAR., P.R. China, IEEE 2007; pp. 312-315.

* cited by examiner

*Primary Examiner* — Long Nguyen

(57) ABSTRACT

A low voltage level shifter that is suitable for use with subthreshold logic. In one embodiment, the low voltage level shifter includes first and second input transistors coupled to first and second input nodes, respectively, that receive complementary low voltage input signals. A circuit is coupled to the first and second input transistors and to first and second output nodes that generate complementary high voltage output signals. The circuit is configured to transmit a first current to the second output node when the first input transistor is activated, wherein the first current is substantially equal to current drawn by the first input transistor when it is activated. The circuit is also configured to transmit a second current to the first output node when the second input transistor is activated, wherein the second current is substantially equal to current drawn by the second input transistor when it is activated.

15 Claims, 3 Drawing Sheets

LOW VOLTAGE LEVEL SHIFTER SUITABLE FOR USE WITH SUBTHRESHOLD LOGIC

BACKGROUND

The increasing complexity of modern electronic design has led to digital systems with domains that operate at different supply voltages. This leads to digital signals in one domain having a voltage range that is different from the voltage range in another domain. It is not unusual that one domain operating at a low supply voltage must communicate with another operating at a high supply voltage. Consider a microcontroller in data communication with external memory. The core of the microcontroller is powered by a low supply voltage VDDL, while the external memory is powered by a high supply voltage VDDH. The core uses low-voltage digital signals, which switch between VDDL and ground. The external memory expects to receive high-voltage digital signals, which switch between VDDH and ground. The low-voltage digital signals cannot be correctly sampled and stored in the external memory unless they are first converted (i.e., shifted) to high-voltage digital signals. Voltage level shifters can perform this conversion.

BRIEF DESCRIPTION OF THE DRAWINGS

The present technology may be better understood, and its numerous objects, features, and advantages made apparent to those skilled in the art by referencing the accompanying drawings.

The use of the same reference symbols in different drawings indicates similar or identical items unless otherwise noted. The Figures are not necessarily drawn to scale.

DETAILED DESCRIPTION

The present technology relates to voltage level shifters, which are devices that enable digital communication between domains operating at different supply voltages. Lower supply voltages present problems for voltage level shifters. More particularly, lower supply voltages can adversely affect the speed at which voltage level shifters can operate. Larger voltage level shifters can accommodate lower supply voltages and maintain speed of operation. But larger shifters consume more power and require more semiconductor surface area. The present technology addresses these issues and others.

For the purpose of explanation only, the present technology will be described with reference to a voltage level shifter used in an input/output (I/O) interface of a microcontroller, it being understood the present technology should not be limited thereto. Digital cores of modern microcontrollers operate at low supply voltages in order to reduce power consumption. Many peripherals to microcontrollers operate at relatively higher supply voltages. Voltage level shifters are added to I/O interfaces in microcontrollers to facilitate communication between the core and higher supply voltage peripherals.

Figure 1:
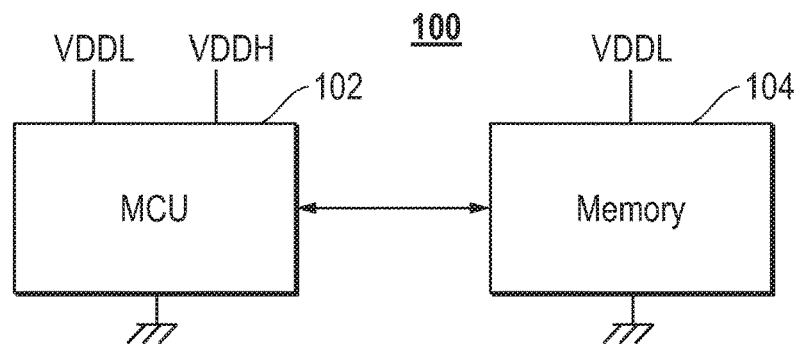
FIG. 1 is a block diagram illustrating a digital system employing multiple voltage sections or domains.
Figure 2:
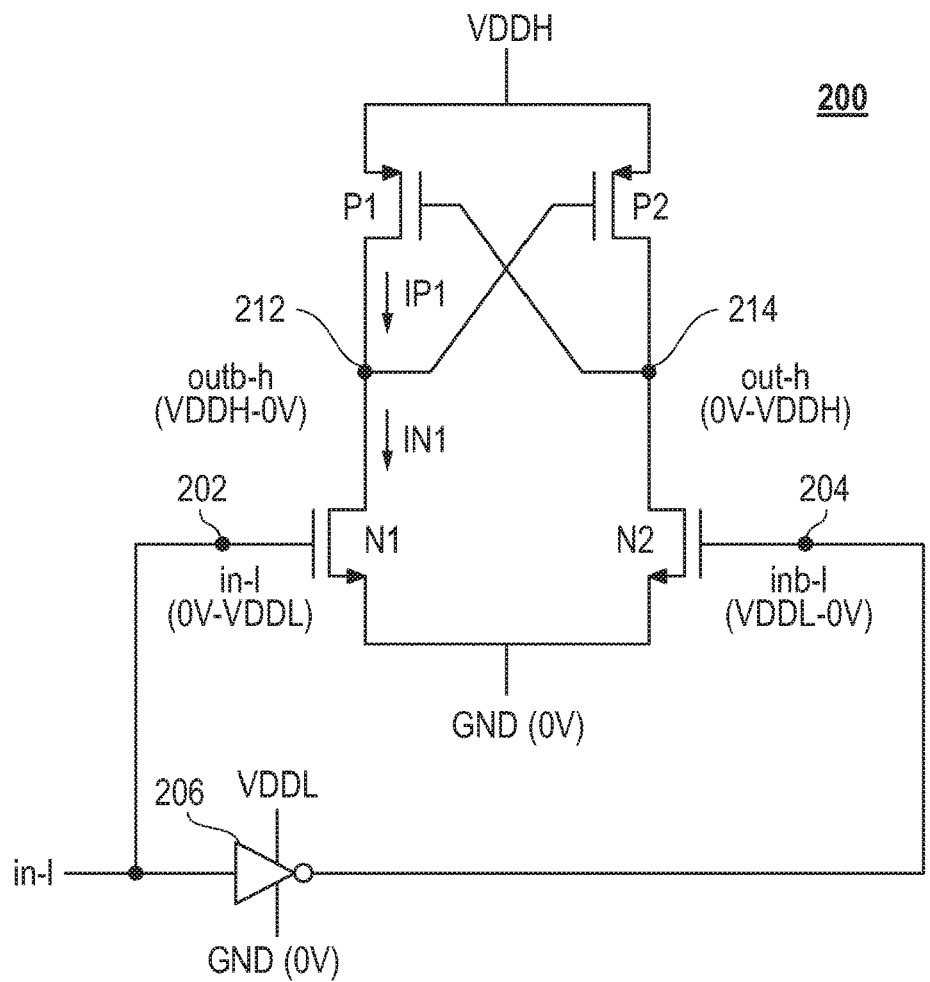
FIG. 2 is schematic diagram of a voltage level shifter employed in the digital system of FIG. 1.

FIG. 1 shows a digital system 100 that includes a microcontroller 102 coupled to a peripheral 104. FIG. 2 shows a voltage level shifter 200, which is contained in an I/O interface (not shown) of microcontroller 102. Level shifter 200 enables communication between the microcontroller core and peripheral 102 by converting low-voltage, complementary input signals in-1 and inb-1 into high voltage, complementary output signals out-h and outb-h.

Voltage level shifter 200 includes a pair of equally sized P-channel, metal oxide semiconductor field-effect (PMOS) transistors P1 and P2, which are connected as shown to a pair of equally sized N-channel, semiconductor metal oxide field-effect (NMOS) transistors N1 and N2. The combination of the PMOS and NMOS transistors is connected between supply voltage VDDH and ground GND. Ground GND is presumed to be 0 V in FIG. 1.

With continuing reference to FIG. 1, FIG. 2 also shows an inverter 206 that receives digital input signal in-1 from the core (not shown) of microcontroller 102, which operates at supply voltage VDDL. VDDH is greater than VDDL. Inverter 206 generates inb-1, which is the complement or inverse logic of in-1. Inverter 206 is coupled between VDDL and GND, and as result inb-1, like in-1, swings between VDDL and GND.

Input nodes 202 and 204 are connected to the gates of N1 and N2, respectively, and receive input signals in-1 and inb-1, respectively, as shown. The drains of N1 and N2 are connected to output nodes 212 and 214, respectively, and the gates of P2 and P1, respectively. Level shifter 200 generates output signals outb-h and out-h at output nodes 212 and 214, respectively, the voltages of which vary between VDDH and GND.

To illustrate the shortcomings of level shifter 200 when it transitions, consider an initial steady state in which input signal in-1 is at GND (i.e., in-1 is in the logic low state) and input signal inb-1 is at VDDL (i.e., inb-1 is in the logic high state). N1 is off or inactive in this initial state, and N2 is on or active. Activated N2 maintains out-h=GND at output node 204, which in turn activates transistor P1. With N1 inactive, active P1 maintains outb-h=VDDH at output node 202. In the steady state, there is no active current path between VDDH and GND.

Voltage level shifter 200 transitions to the complementary state when the input signals invert (i.e., in-1 switches from GND to VDDL, and inb-1 switches from VDDL to GND). With this transition N1 quickly activates, and N2 quickly deactivates. Out-h at node 214, however, does not immediately switch since P2 is inactive when N2 is deactivated, and node 214 is in a high impedance state. In other words, out-h lingers at GND. And as a result P1 lingers in the active state. Out-h will continue to linger at GND until P2 is activated and transmits current from VDDH Importantly, P2 will not activate until node 212 switches down from VDDH to GND. Since P1 is lingering in the active state, and since N1 is activated, P1 and N1 transmit current, albeit for a brief period of time. Effective switching (i.e., reasonably fast) will occur if N1 can pull more current than P1 can pull from VDDH on its own. In other words effective switching is achieved with IN1>IP1, where IN1 is the drain saturation current of N1 and IP1 is the drain saturation current of P1. It is noted that P2 and N2 are subject to the same constraints and analysis when the input signals subsequently invert.

IN1 and IP1 can be represented by the saturation current equations (1) and (2) below.

$$IN1 = WN1/LN1 \cdot (\mu_N C_{OX}/2) \cdot (VDDL - V_{THN})^2, \quad (1)$$

where:
WN1 is the effective channel width of N1 (m)
LN1 is the effective channel length of N1 (m)
$\mu_N$ is the NMOS silicon surface mobility (cm²/V-s)
$C_{OX}$ is the capacitance per unit area of the gate oxide (F/cm²)
$V_{THN}$ is the threshold voltage of NMOS (V).

$$IP1 = WP1/LP1 \cdot (\mu_P C_{OX}/2) \cdot (VDDH - V_{THP})^2, \quad (2)$$

where:
WP1 is the effective channel width of P1 (m)
LP1 is the effective channel length of P1 (m)
$\mu_P$ is the PMOS silicon surface mobility (cm²/V-s)
$C_{OX}$ is the capacitance per unit area of the gate oxide (F/cm²)
$V_{THP}$ is the threshold voltage of PMOS (V).

The inequality IN1>IP1 can be rewritten by replacing IN1 and IP1 with equations (1) and (2), rearranging the terms to yield equations (3) and then (4) below:

$$WN1/LN1 \cdot (\mu_N C_{OX}/2) \cdot (VDDL - V_{THN})^2 > WP1/LP1 \cdot (\mu_P C_{OX}/2) \cdot (VDDH - V_{THP})^2 \quad (3)$$

$$(WN1/LN1)/(LP1/WP1) > \mu_P/\mu_N \cdot (VDDH - V_{THP})^2 / (VDDL - V_{THN})^2 \quad (4)$$

For a given technology at 27° C. the parameters of equation (4) will be:
$\mu_N/\mu_P = 3.747$
$V_{THN} = 0.503$ (V)
$V_{THP} = 0.525$ (V)

Transistors P1 and N1 are presumed to have the following effective channel widths and lengths:
P1: LP1=1.8 μm WP1=0.4 μm
N1: LN1=0.6 μm WN1=1.8 μm With the foregoing parameters and channel lengths and widths, and with VDDH=1.8 V, VDDL should be greater than 0.68 V to maintain inequality (4), and thus IN1>IP1, the condition for effective transition of outb-h at node 212 to GND.

Figure 5:
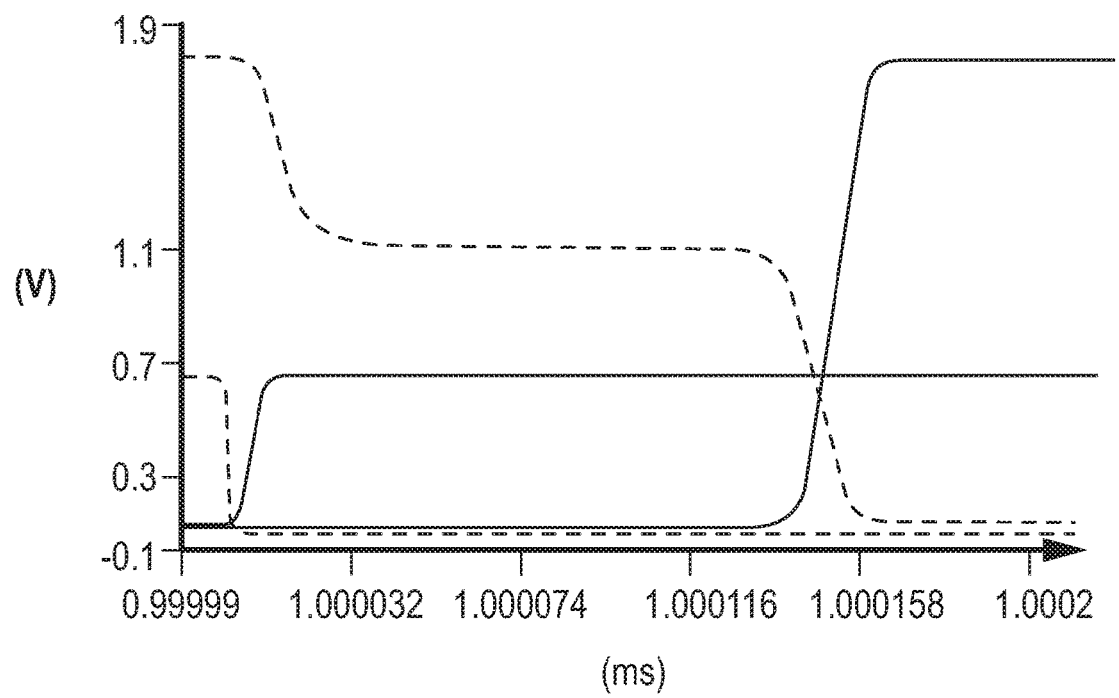
FIG. 5 is a graphical representation of signals that illustrate operational aspects of the voltage level shifter shown in FIG. 2.

FIG. 5 is a graphical representation of operational aspects of level shifter 200 that is provided by a computer simulation with the parameters above, VDDH=1.8 V and VDDL=0.63 V, a value slightly below VDDL=0.68 V. The graph is substantially drawn to scale and shows that level shifter begins to transition around 1.0000005 milliseconds and completes its transition around 1.000158 milliseconds, for a total transition delay time of approximately 0.1575 microseconds. A delay of 0.1575 microseconds may be unacceptably long for an I/O interface that contains shifter 200. Another problem is the size of shifter 200. In the illustrated example of FIG. 2, LP1=1.8 μm and WN1=1.8 μm, which are larger than lengths and widths of common logic gates in the core of microcontroller 102.

One solution to the switching speed problem of shifter 200 is to increase the size of the transistors. The magnitude of the currents IN1 and IP1 depends on the sizes of P1 and N1. If effective channel width WN1 is increased, current IN1 will increase correspondingly when in-1 switches from GND to VDDL. The increase in IN1 will reduce the switching delay at node 212. Unfortunately, the increase in current IN1 will increase the power consumed by shifter 200. And perhaps even more unfortunately, increasing the effective channel width WN1 may present an engineering challenge in designs that have limited semiconductor surface area. In addition or alternatively, the effective channel length LP1 of P1 can be increased in order to increase the source to drain resistance in P1. This increase in source to drain resistance will reduce the switching delay at node 212. But an increase in source to drain resistance in P1 will result in a slower shifter 200. And an increase in the effective channel length LP1 will also require more area on the semiconductor substrate. Another problem is that VDDL=0.68 V represents the calculated theoretical minimal supply voltage at which shifter 200 can operate effectively given the parameters, widths, and lengths above. But, many modern microcontrollers employ subthreshold logic and require a core supply voltage that is less than 0.68 V.

Figure 3:
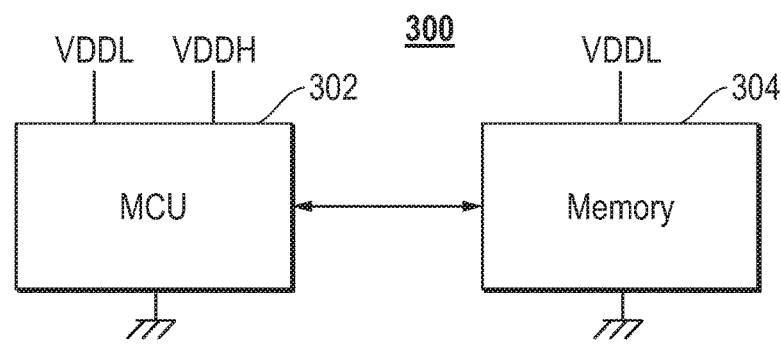
FIG. 3 is a block diagram illustrating a digital system employing the present technology.
Figure 4:
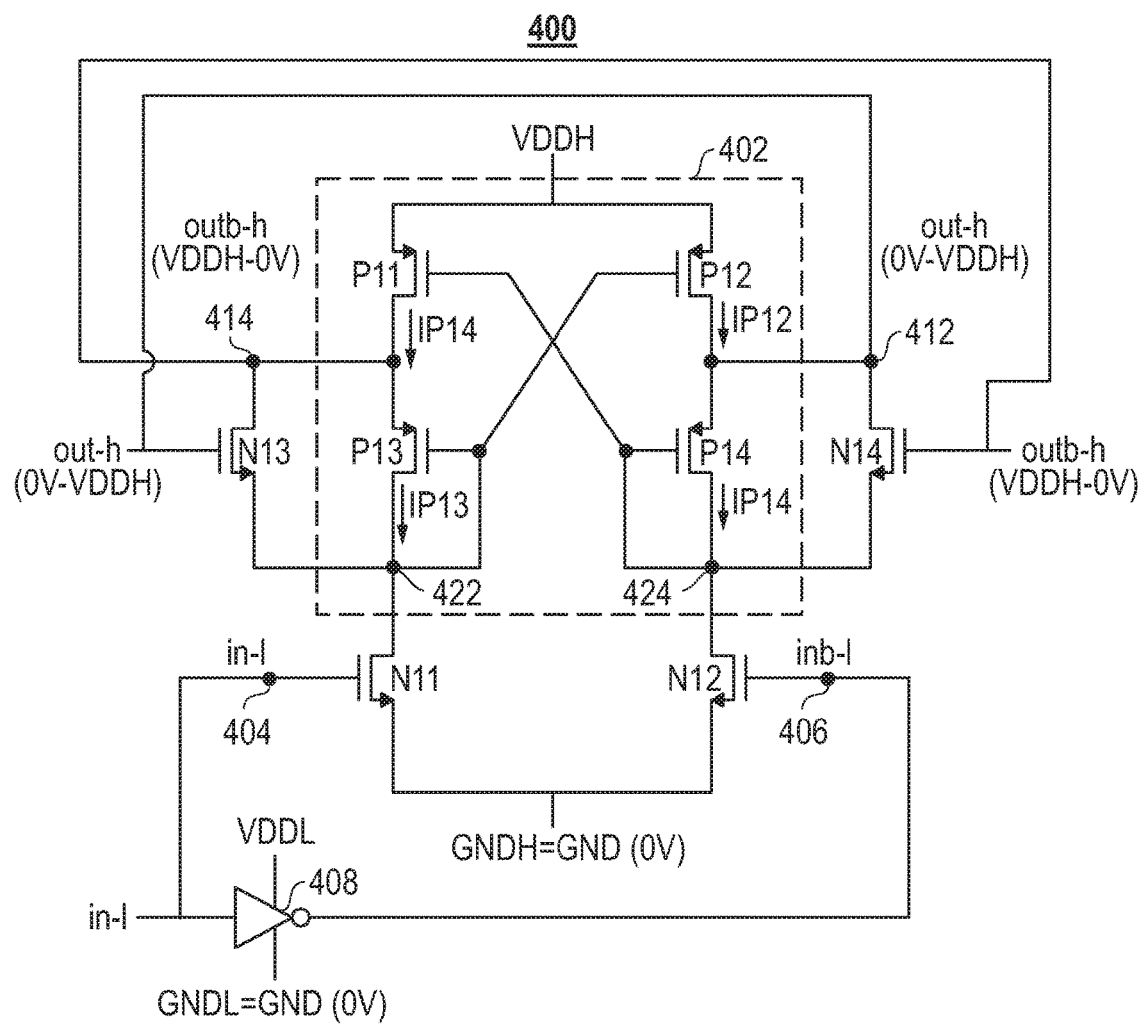
FIG. 4 is schematic diagram of a voltage level shifter employing one embodiment of the present technology.

The present technology addresses the foregoing problems and provides a low voltage level shifter that is suitable for use with subthreshold logic in, for example, a microcontroller. FIG. 3 illustrates a digital system 300 that includes a microcontroller 302 coupled to peripheral 304. FIG. 4 illustrates a low voltage level shifter 400 employed in an I/O interface (not shown) of microcontroller 302. Level shifter 400 employs one embodiment of the present technology.

Level shifter 400 includes a course, reversible current mirror 402 connected as shown to NMOS transistors N11-N14. Like N1 and N2 in FIG. 2, the gate of N11 receives input signal in-1, and the gate of N12 receives complementary input signal inb-1 from inverter 408. Input signals in-1 and inb-1 swing between VDDL and ground GNDL. Shifter 400 generates output signals out-h and outb-h at output nodes 412 and 414, respectively. The gates of N13 and N14 receive output signals out-h and outb-h, respectively, the voltages of which vary between ground GNDH and VDDH. Input transistors N11 and N12 are connected between reversible current mirror 402 and ground GNDH. In one embodiment, GNDH and GNDL can be at different potentials. However, for purposes of explanation only, GNDH=GNDL=GND=0 V, it being understood the present technology should not be limited thereto.

Reversible current mirror 402 operates in a forward mode or a reverse mode. Current mirror 402 enters the forward mode when input signal in-1 switches from GND to VDDL and input signal inb-1 switches from VDDL to GND. This activates N11 and deactivates N12. Activated N11 draws current to pull its drain to GND. Current mirror 402 drives output node 412 with a first current that substantially equals (i.e., coarsely mirrors) the current drawn by activated N11. Current mirror 402 will continue to drive output node 412 until it reaches VDDH. Output node 412 has no pull down current, and as a result very little first current is needed to drive output node 412 to VDDH. In other words, out-h at node 412 quickly switches to VDDH. The gate of N13 is connected to output node 412 and is controlled by out-h. When output node 412 is driven to VDDH, N13 activates and connects output node 414 to the drain of activated N11. This ensures output node 414 is pulled down to GND via activated N11. In other words, outb-h at node 414 quickly switches to GND.

Current mirror 402 enters the reverse mode of operation when input signal in-1 switches from VDDL to GND and input signal inb-1 switches from GND to VDDL, which activates N12 and deactivates N11. Current mirror 402 drives output node 414 with a second current that is substantially equal to (i.e., coarsely mirrors) the current drawn by activated N12 as it pulls down its drain to GND. Current mirror 402 will continue to drive output node 414 with the second current until node 414 reaches VDDH. Output node 414 has no pull down current, and as a result very little current is needed to drive node 414 and outb-h to VDDH.

The gate of N14 is connected to output node 414 and thus controlled by outb-h. When output node 414 is driven to VDDH, N14 activates and connects output node 412 to the drain of activated N12. This ensures that output node 412 is pulled down to GND. In other words, out-h at node 412 quickly switches to GND.

The foregoing generally describes the forward and reverse modes of reversible current mirror 402. Reversible current mirror 402 may take any one of many different configurations. One embodiment of reversible current mirror 402 is shown in FIG. 4. In this embodiment, reversible current mirror 402 includes a course first current mirror that includes PMOS transistors P12 and P13 coupled together as shown, and a course second current mirror that includes PMOS transistors P11 and P14 coupled together as shown. P13 and P14 take form in diode connected transistors.

In general a current mirror is a circuit designed to copy or mirror a current through one active device by controlling the current in another active device, regardless of loading on the other device. The current being mirrored (i.e., the reference current) can be, and sometimes is, a varying signal current. The current mirrors operate on the general principal that equally sized transistors operating at the same temperature with essentially the same gate to source voltage, have the same drain current. P11-P14 are equally sized.

To illustrate the advantages of level shifter 400, consider an initial steady state in which in-1=GND and inb-1=VDDL. In this state intermediate node 424 is at GND via activated N12. With intermediate node 424 at GND, P11 is activated and ties output node 414 to VDDH, which in turn activates N14. Output node 412 is tied to ground via activated N12 and N14. Thus, in this initial state out-h=GND and outb-h=VDDH.

The first current mirror begins to transmit current when input signal in-1 switches from GND to VDDL and input signal inb-1 switches from VDDL to GND. With this transition N11 quickly activates, and N12 quickly deactivates. The voltages at intermediate node 424 and output node 412, however, do not change quickly since these nodes are in a high impedance state, and P12 is initially inactive. In other words, nodes 412 and 424 linger at GND and are in high impedance. And P11 lingers in its initial active state and transmits current I13 to intermediate node 422 via diode coupled transistor P13 as intermediate node 422 is being pulled down to ground by activated N11. However, first current (i.e., drain current IP12) of P12 substantially mirrors drain current IP13 of P13. First current IP12 quickly switches high impedance output node 412 to VDDH. In other words, out-h quickly switches to VDDH. Out-h controls N13, and as a result, N13 activates and couples output node 414 to intermediate node 422, which is being pulled to ground. Ultimately the first current mirror of FIG. 4 eliminates the current constraint IN1>IP1 that is required in level shifter 200 for effective switching.

The second current mirror (i.e., the P11 and P14) operates in substantially the same way. The second current mirror begins to operate when input signal in-1 switches from VDDL to GND and input signal inb-1 switches from GND to VDDL. With this transition N12 quickly activates, and N11 quickly deactivates. The voltage at intermediate node 422 and output node 414, however, do not change quickly since these nodes are in a high impedance state, and P11 is initially inactive. In other words, nodes 414 and 424 linger at GND. And P12 lingers in its initial active state and begins to transmit current to intermediate node 424 via diode coupled transistor P14 as intermediate node 424 is being pulled down to ground via activated N12. However, the second current (i.e., drain current IP11 of P11) substantially mirrors drain current IP13 of P13. The second current IP11 charges output node 414 to VDDH. In other words, outb-h quickly switches to VDDH. Outb-h controls N14, and as a result, N14 quickly activates and couples output node 412 to intermediate node 424, which is being pulled to ground.

Shifter 400 can operate faster than shifter 200 while occupying less area. Shifter 400 was computer simulated with the following channel parameters, it being understood the present technology should not be limited to these channel parameters:

WN11=0.4 μm LN11=0.6 μm
WN12=0.4 μm LN12=0.6 μm
WN13=0.32 μm LN13=0.55 μm
WN14=0.32 μm LN14=0.55 μm
WP11=0.4 μm LP11=0.4 μm
WP12=0.4 μm LP12=0.4 μm
WP13=0.4 μm LP13=0.4 μm
WP14=0.4 μm LP14=0.4 μm

Figure 6:
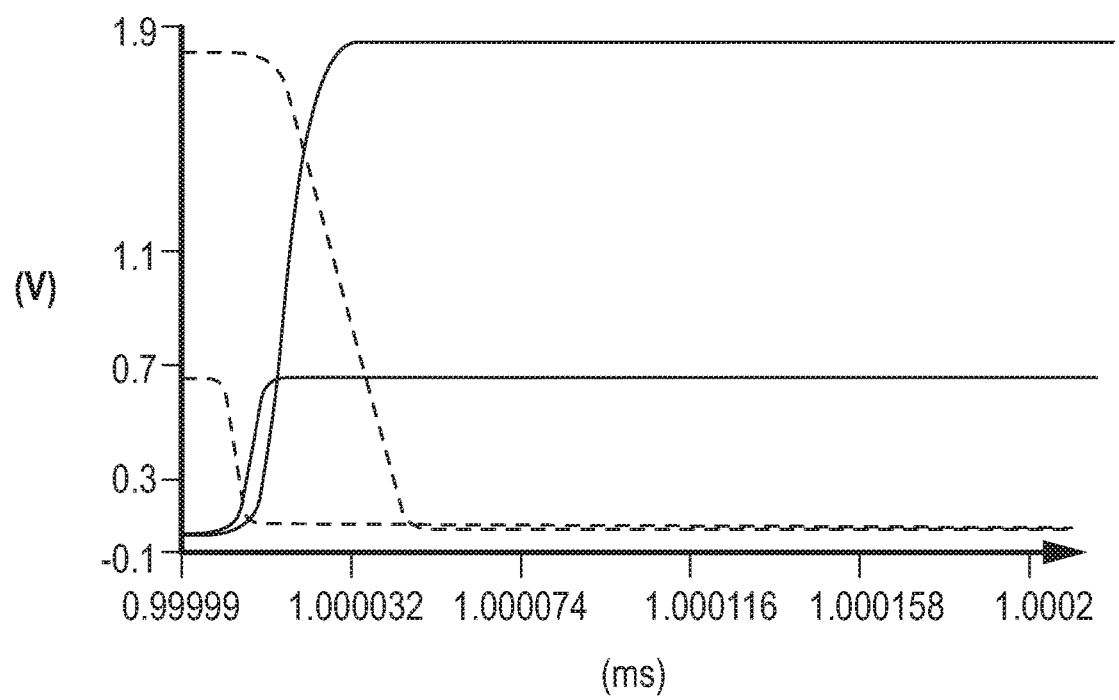
FIG. 6 is a graphical representation of signals that illustrate operational aspects of the voltage level shifter shown in FIG. 4.

FIG. 6 shows aspects of computer simulation of level shifter 400 with VDDL=0.63 V, VDDH=1.8 V, which are the same supply voltages used in simulation of shifter 200 shown in FIG. 5. A comparison of FIGS. 5 and 6 shows the speed advantage of shifter 400 over shifter 200. The transition delay of shifter 400 is about 0.042 microseconds versus 0.1575 microseconds for shifter 200. Further, and though not shown in the figures, shifter 400 consumes less power than shifter 200 during the transition. Perhaps more importantly, if VDDL is further reduced to 0.5 V and less, the transition delay for shifter 200 would increase substantially, but the transition delay for shifter 400 will not. One of ordinary skill also understands that N11-N14 with the channel parameters above, occupies less area on a semiconductor compared to the area needed by N1 and N2 of the level shifter 200, and similarly P11-P14 with the channel parameters above, occupies less area than the area needed by P1 and P2. Collectively the transistors of shifter 400 occupies less area than the area occupied by transistors of shifter 200.

For ease of illustration the bodies of all PMOS transistors are connected to VDDH, and the body of all NMOS transistors are connected to ground, even though these connections are not shown in the figures.

Effective channel length and effective channel width may differ slightly from the gate length and gate width of transistors. For purposes of explanation the effective channel length and effective channel width are presumed to be equal to the gate length and gate width, respectively, in this disclosure.

This description uses the terms "connected" and "coupled." The term coupled is broader than the term connected. The term connected means a direct connection between devices such as transistors. In other words, there is no device intervening between two connected devices, other than parasitic capacitance, inductance, and/or resistance between the devices. In contrast, two devices can be "coupled" together either directly (i.e., connected), or indirectly via an intervening device.

A level shifter circuit has been disclosed. In a first embodiment the level shifter circuit includes a first pair of transistors connected to a first supply voltage node. A pair of diode connected transistors are connected to the first pair of transistors, respectively, via first and second output nodes, respectively. A second pair of transistors are connected to the pair of diode connected transistors, respectively, via first and second intermediate nodes, respectively, and a ground node. Gates of the second pair of transistors are connected to a pair of input nodes, respectively. Gates of the pair of diode connected transistors are connected to the first and second intermediate nodes, respectively. And gates of the first pair of transistors are connected to the second and first intermediate nodes, respectively.

The level shifter circuit of the first embodiment may further include a third pair of transistors. Drains of the third pair of transistors are connected to the first and second output nodes, respectively. Sources of the third pair of transistors are connected to the first and second intermediate nodes, respectively. And gates of the third pair of transistors are connected to the second and first output nodes, respectively.

The gate widths of the first pair of transistors, the second pair of transistors and the pair of diode connected transistors of an embodiment, are substantially equal.

The gate lengths and gate widths of the first pair of transistors and the pair of diode connected transistors of an embodiment, are substantially equal.

The first pair of transistors and the pair of diode connected transistors of an embodiment, are substantially equal in size.

The gate lengths and gate widths of the first pair of transistors and the pair of diode connected transistors of an embodiment, are substantially equal.

The circuit of the first embodiment may further include a second supply voltage node, an inverter connected to the second supply voltage node and coupled between the pair of input nodes. The first and second supply voltage nodes are configured to receive first and second supply voltages, respectively.

In a second embodiment the level shifter circuit may include first and second input nodes, first and second output nodes, first and second input transistors coupled to the first and second input nodes, respectively, and a circuit coupled to the first and second input transistors and to the first and second output nodes. The circuit is configured to transmit a first current to the second output node when the first input transistor is activated. The first current is substantially equal to current drawn by the first input transistor when it is activated. The circuit is configured to transmit a second current to the first output node when the second input transistor is activated. The second current is substantially equal to current drawn by the second input transistor when it is activated.

The level shifter circuit of the second embodiment may further include a first supply voltage node. The circuit coupled to the first and second input transistors, includes first and second transistors coupled to the first supply node, and first and second diode connected transistors coupled to the first second transistors, respectively. The first output node is connected between the first transistor and the first diode connected transistor. The second output node is connected between the second transistor and the second diode connected transistor. Current in the second transistor is substantially equal to current in the first diode connected transistor when the first input transistor is activated. And current in the first transistor is substantially equal to current in the second diode connected transistor when the second input transistor is activated.

The level shifter circuit of an embodiment may further include third and fourth transistors, and first and second intermediate nodes. The first intermediate node is connected between the first diode connected transistor and the first input transistor, and wherein the second intermediate node is connected between the second diode connected transistor and the second input transistor. The third transistor is connected between the first output node and first intermediate node. The fourth transistor is connected between the second output node and the second intermediate node. Gates of the third and fourth transistors are connected to the second and first output nodes, respectively.

Gate lengths and gate widths of the first and second transistors, and the first and second diode connected transistors of an embodiment, are substantially equal.

Gate widths of the first and second transistors, the first and second diode connected transistors, and the first and second input transistors of an embodiment, are substantially equal.

Lengths of the first and second inputs are greater than lengths of the first and second transistors in an embodiment.

The level shifter circuit of an embodiment may further include a second supply voltage node, and an inverter connected to the second supply voltage node and coupled between the first and second input transistors. The first and second supply voltage nodes are configured to receive first and second supply voltages, respectively.

In a third embodiment the level shifter circuit may include first and second input nodes, first and second output nodes, first and second input transistors coupled to the first and second input nodes, respectively, a first current mirror coupled to the first input transistor and the second output node. The first current mirror is configured to transmit current to the second output node, which is substantially equal to current drawn by the first input transistor when it is activated. In addition a second current mirror may be included and coupled to the second input transistor and the first output node. The second current mirror is configured to transmit current to the first output node, which is substantially equal to current drawn by the second input transistor when it is activated.

In the third embodiment the first current mirror includes a first transistor and a first diode connected transistor. Gates of the first transistor and first diode connected transistor are connected together, and a drain of the first transistor is connected to the second output node. The second current mirror includes a second transistor and a second diode connected transistor. Gates of the second transistor and second diode connected transistor are connected together, and a drain of the second transistor is connected to the first output node.

The level shifter circuit of an embodiment may include third and fourth transistors, and first and second intermediate nodes. The first intermediate node is connected between the first diode connected transistor and the first input transistor, and the second intermediate node is connected between the second diode connected transistor and the second input transistor. The third transistor is connected between the first output node and first intermediate node, and the fourth transistor is connected between the second output node and the second intermediate node.

Gate lengths and gate widths of the first transistor and the first diode connected transistor and second transistors of an embodiment, are substantially equal. Gate lengths and gate widths of the second transistor and the second diode connected transistor and second transistors of an embodiment, are substantially equal.

The first transistor and the first diode connected transistor of the third embodiment, are substantially equal in size. The second transistor and the second diode connected transistor of an embodiment, are substantially equal in size.

Gate widths of the first and second input transistors, the first and second transistors, and the first and second diode connected transistors of an embodiment, are substantially equal.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A circuit comprising:
a first pair of transistors connected to a first supply voltage node;
a pair of diode connected transistors, which are connected to the first pair of transistors, respectively, via first and second output nodes, respectively;
a second pair of transistors connected to the pair of diode connected transistors, respectively, via first and second intermediate nodes, respectively, and a ground node;
a third pair of transistors;
wherein gates of the second pair of transistors are connected to a pair of input nodes, respectively;
wherein gates of the pair of diode connected transistors are connected to the first and second intermediate nodes, respectively;
wherein gates of the first pair of transistors are connected to the second and first intermediate nodes, respectively;
wherein drains of the third pair of transistors are connected to the first and second output nodes, respectively;
wherein sources of the third pair of transistors are connected to the first and second intermediate nodes, respectively;
wherein gates of the third pair of transistors are connected to the second and first output nodes, respectively.

2. The circuit of claim 1 wherein gate widths of the first pair of transistors, the second pair of transistors and the pair of diode connected transistors, are substantially equal.

3. The circuit of claim 2 wherein gate lengths and gate widths of the first pair of transistors and the pair of diode connected transistors, are substantially equal.

4. The circuit of claim 1 wherein the first pair of transistors and the pair of diode connected transistors, are substantially equal in size.

5. The circuit of claim 4 wherein gate lengths and gate widths of the first pair of transistors and the pair of diode connected transistors, are substantially equal.

6. The circuit of claim 1 further comprising:
a second supply voltage node;
an inverter connected to the second supply voltage node and coupled between the pair of input nodes;
wherein the first and second supply voltage nodes are configured to receive first and second supply voltages, respectively.

7. An apparatus comprising:
first and second input nodes;
first and second output nodes;
a first supply voltage node;
first and second input transistors coupled to the first and second input nodes, respectively;
third and fourth transistors;
first and second intermediate nodes;
a circuit coupled to the first and second input transistors and to the first and second output nodes;
wherein the circuit is configured to transmit a first current to the second output node when the first input transistor is activated, wherein the first current is substantially equal to current drawn by the first input transistor when it is activated;
wherein the circuit is configured to transmit a second current to the first output node when the second input transistor is activated, wherein the second current is substantially equal to current drawn by the second input transistor when it is activated;
wherein the circuit includes:
first and second transistors coupled to the first supply node; and
first and second diode connected transistors coupled to the first and second transistors, respectively;
wherein the first output node is connected between the first transistor and the first diode connected transistor;
wherein the second output node is connected between the second transistor and the second diode connected transistor;
wherein current in the second transistor is substantially equal to current in the first diode connected transistor when the first input transistor is activated;
wherein current in the first transistor is substantially equal to current in the second diode connected transistor when the second input transistor is activated;
wherein the first intermediate node is connected between the first diode connected transistor and the first input transistor, and wherein the second intermediate node is connected between the second diode connected transistor and the second input transistor;
wherein the third transistor is connected between the first output node and first intermediate node;
wherein the fourth transistor is connected between the second output node and the second intermediate node;
wherein gates of the third and fourth transistors are connected to the second and first output nodes, respectively.

8. The apparatus of claim 7 wherein gate lengths and gate widths of the first and second transistors, and first and second diode connected transistors, are substantially equal.

9. The apparatus of claim 8 wherein gate widths of the first and second transistors, the first and second diode connected transistors, and the first and second input transistors, are substantially equal.

10. The apparatus of claim 8 wherein lengths of the first and second inputs are greater than lengths of the first and second transistors.

11. The apparatus of claim 9 further comprising:
a second supply voltage node;
an inverter connected to the second supply voltage node and coupled between the first and second input transistors;
wherein the first and second supply voltage nodes are configured to receive first and second supply voltages, respectively.

12. A circuit comprising:
first and second input nodes;
first and second output nodes;
first and second input transistors coupled to the first and second input nodes, respectively;
a first current mirror coupled to the first input transistor and the second output node, wherein the first current mirror is configured to transmit current to the second output node, which is substantially equal to current drawn by the first input transistor when it is activated;
a second current mirror coupled to the second input transistor and the first output node, wherein the second current mirror is configured to transmit current to the first output node, which is substantially equal to current drawn by the second input transistor when it is activated;
third and fourth transistors;
first and second intermediate nodes;

wherein the first current mirror comprises a first transistor and a first diode connected transistor, wherein gates of the first transistor and first diode connected transistor are connected together, and wherein a drain of the first transistor is connected to the second output node;

wherein the second current mirror comprises a second transistor and a second diode connected transistor, wherein gates of the second transistor and second diode connected transistor are connected together, and wherein a drain of the second transistor is connected to the first output node;

wherein the first intermediate node is connected between the first diode connected transistor and the first input transistor, and wherein the second intermediate node is connected between the second diode connected transistor and the second input transistor;

wherein the third transistor is connected between the first output node and first intermediate node;

wherein the fourth transistor is connected between the second output node and the second intermediate node.

13. The circuit of claim 12 wherein gate widths of the first and second input transistors, the first and second transistors, and the first and second diode connected transistors, are substantially equal.

14. The circuit of claim 12:

wherein gate lengths and gate widths of the first transistor and the first diode connected transistor and second transistors, are substantially equal;

wherein gate lengths and gate widths of the second transistor and the second diode connected transistor and second transistors, are substantially equal.

15. The circuit of claim 12:

wherein the first transistor and the first diode connected transistor, are substantially equal in size;

wherein the second transistor and the second diode connected transistor, are substantially equal in size.

* * * * *